United States Patent
Yamazaki et al.

(10) Patent No.: US 8,828,789 B2
(45) Date of Patent: Sep. 9, 2014

(54) PHOTOVOLTAIC DEVICE AND METHOD FOR MANUFACTURING THE SAME

(75) Inventors: Shunpei Yamazaki, Setagaya (JP); Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 769 days.

(21) Appl. No.: 13/020,238

(22) Filed: Feb. 3, 2011

(65) Prior Publication Data

US 2011/0124151 A1 May 26, 2011

Related U.S. Application Data

(62) Division of application No. 12/078,087, filed on Mar. 27, 2008, now abandoned.

(30) Foreign Application Priority Data

Apr. 6, 2007 (JP) ................................ 2007-101182

(51) Int. Cl.
*H01L 31/0224* (2006.01)

(52) U.S. Cl.
USPC .................. 438/98; 438/57; 257/E31.124

(58) Field of Classification Search
None
See application file for complete search history.

(56) References Cited

U.S. PATENT DOCUMENTS

| | | | |
|---|---|---|---|
| 4,180,618 A | 12/1979 | Alpha et al. | |
| 4,633,034 A | 12/1986 | Nath et al. | |
| 4,665,277 A | 5/1987 | Sah et al. | |
| 5,259,891 A | 11/1993 | Matsuyama et al. | |
| 5,328,519 A | 7/1994 | Kawakami | |
| 5,665,607 A | 9/1997 | Kawama et al. | |
| 5,811,348 A | 9/1998 | Matsushita et al. | |
| 6,331,208 B1 | 12/2001 | Nishida et al. | |
| 6,468,884 B2 | 10/2002 | Miyake et al. | |
| 6,468,923 B1 | 10/2002 | Yonehara et al. | |
| 6,486,041 B2 | 11/2002 | Henley et al. | |
| 6,566,277 B1 | 5/2003 | Nakagawa et al. | |
| 6,692,981 B2 | 2/2004 | Takato et al. | |

(Continued)

FOREIGN PATENT DOCUMENTS

| | | |
|---|---|---|
| EP | 1039513 A | 9/2000 |
| EP | 1 088 913 | 4/2001 |

(Continued)

OTHER PUBLICATIONS

Invitation to Pay Additional Fees (Application No. PCT/JP2008/056254), International Search Authority, Dated May 1, 2008.

(Continued)

*Primary Examiner* — Seahvosh Nikmanesh
(74) *Attorney, Agent, or Firm* — Eric J. Robinson; Robinson Intellectual Property Law Office, P.C.

(57) ABSTRACT

It is the gist of the present invention to provide a photovoltaic device in which a single crystal semiconductor layer provided over a substrate having an insulating surface or an insulating substrate is used as a photoelectric conversion layer, and the single crystal semiconductor layer is provided with a so-called SOI structure where the single crystal semiconductor layer is bonded to the substrate with an insulating layer interposed therebetween. As the single crystal semiconductor layer having a function as a photoelectric conversion layer, a single crystal semiconductor layer obtained by separation and transfer of an outer layer portion of a single crystal semiconductor substrate is used.

10 Claims, 16 Drawing Sheets

(56) References Cited

U.S. PATENT DOCUMENTS

| | | |
|---|---|---|
| 6,818,529 B2 | 11/2004 | Bachrach et al. |
| 7,019,339 B2 | 3/2006 | Atwater et al. |
| 7,141,834 B2 | 11/2006 | Atwater et al. |
| 7,238,622 B2 | 7/2007 | Atwater et al. |
| 7,244,990 B2 | 7/2007 | Takafuji et al. |
| 7,341,927 B2 | 3/2008 | Atwater et al. |
| 7,755,109 B2 | 7/2010 | Atwater et al. |
| 7,759,220 B2 | 7/2010 | Henley |
| 7,919,392 B2 | 4/2011 | Takafuji et al. |
| 2005/0014859 A1 | 1/2005 | Iyama et al. |
| 2005/0022864 A1 | 2/2005 | Fujioka et al. |
| 2005/0026432 A1 | 2/2005 | Atwater et al. |
| 2005/0085049 A1 | 4/2005 | Atwater et al. |
| 2005/0275067 A1 | 12/2005 | Atwater et al. |
| 2006/0065299 A1 | 3/2006 | Fukawa et al. |
| 2006/0208341 A1 | 9/2006 | Atwater et al. |
| 2007/0235734 A1 | 10/2007 | Takafuji et al. |
| 2008/0251126 A1 | 10/2008 | Yamazaki et al. |

FOREIGN PATENT DOCUMENTS

| | | |
|---|---|---|
| EP | 1463105 A | 9/2004 |
| JP | 01-227307 | 9/1989 |
| JP | 10-093122 | 4/1998 |
| JP | 10-335683 | 12/1998 |
| JP | 2000-150940 | 5/2000 |
| JP | 2000-349266 A | 12/2000 |
| JP | 2001-089291 A | 4/2001 |
| JP | 2001-160540 | 6/2001 |
| JP | 2002-100789 | 4/2002 |
| JP | 2002-348198 | 12/2002 |
| JP | 2003-324188 | 11/2003 |
| JP | 2004-014958 | 1/2004 |
| JP | 2004-087667 | 3/2004 |
| JP | 2004-288780 A | 10/2004 |
| JP | 2004-296599 A | 10/2004 |
| JP | 1 505 174 | 2/2005 |
| JP | 2005-050905 | 2/2005 |
| JP | 2005-268682 | 9/2005 |
| WO | WO-02/084725 | 10/2002 |
| WO | WO-2005/060723 | 7/2005 |
| WO | WO-2005/079198 | 9/2005 |

OTHER PUBLICATIONS

International Search Report (Application No. PCT/JP2008/056254) dated Jun. 24, 2008.

Written Opinion (Application No. PCT/JP2008/056254) dated Jun. 24, 2008.

Werner.J et al., "Recent Progress on Transfer-SI Solar Cells At ipe Stuttgart", 3rd World Conference on Photovoltaic Energy Conversion (WCPEC-3), May 11, 2003, pp. 1272-1275, IEEE.

European Search Report (Application No. 08739371.6) Dated Apr. 22, 2014.

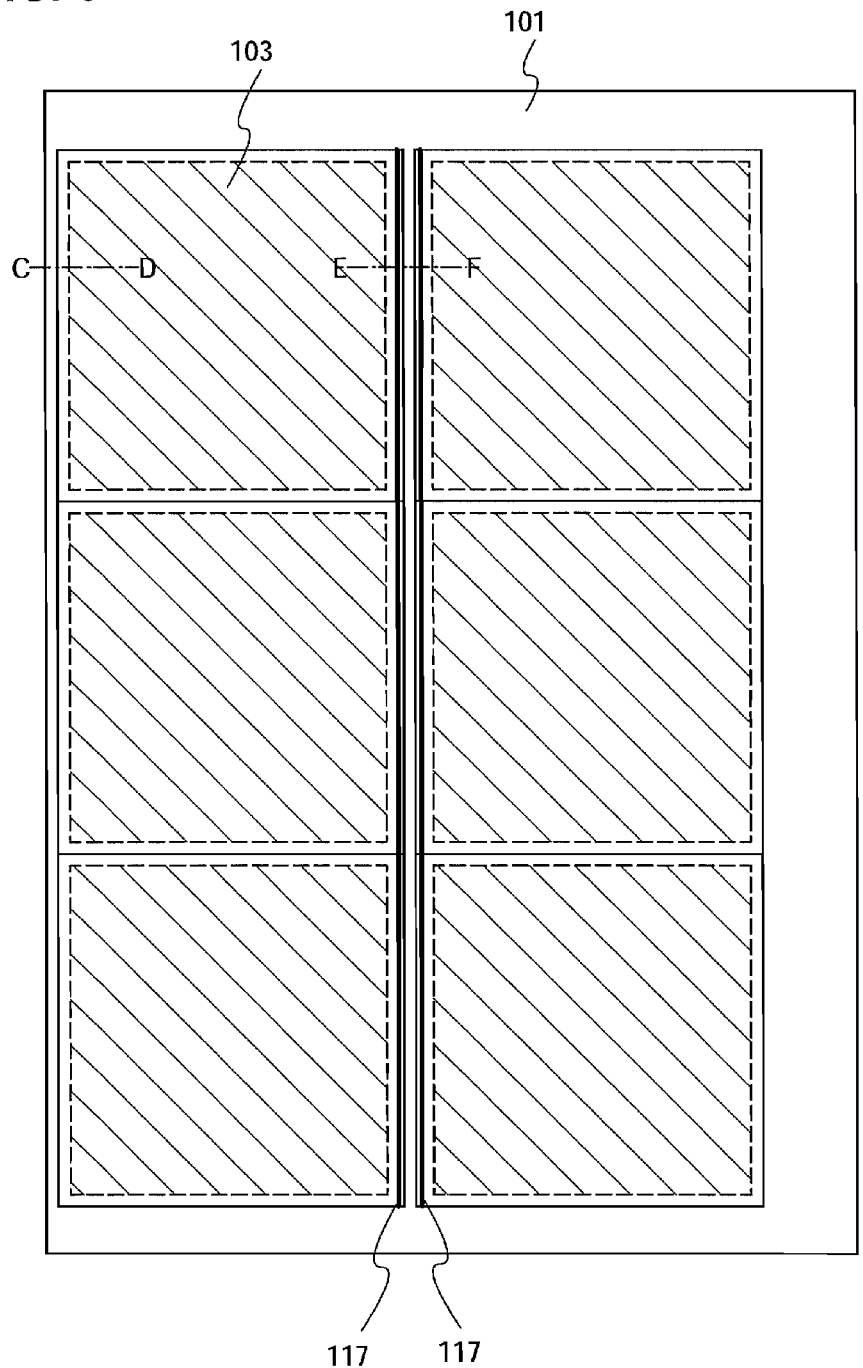

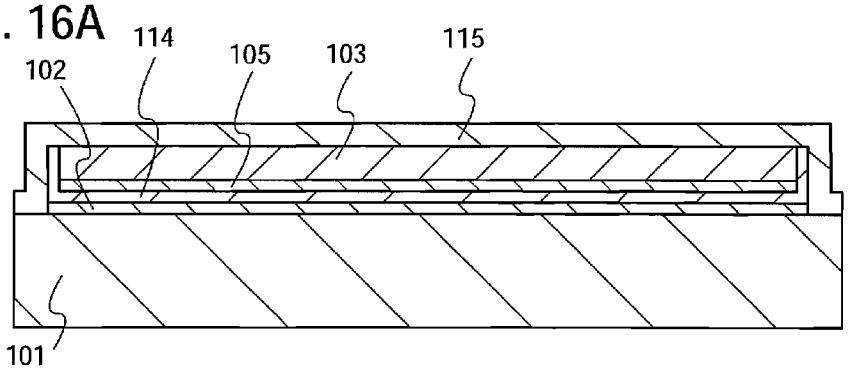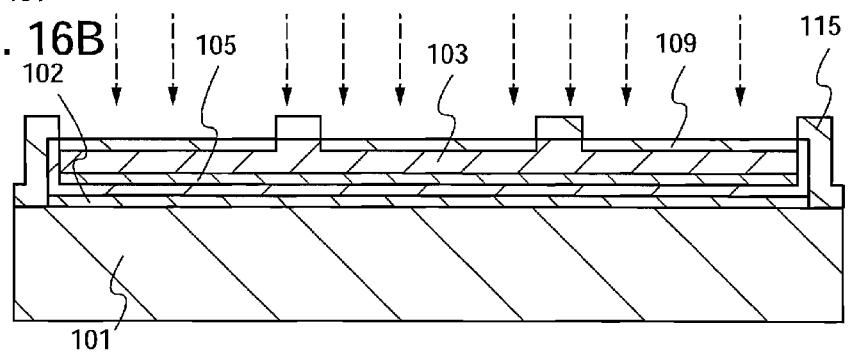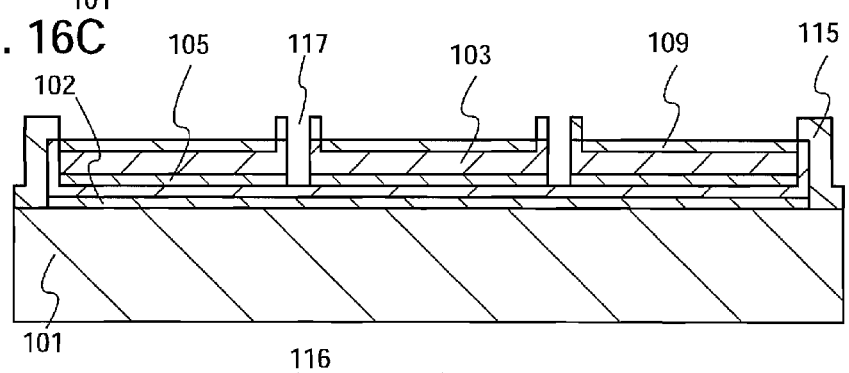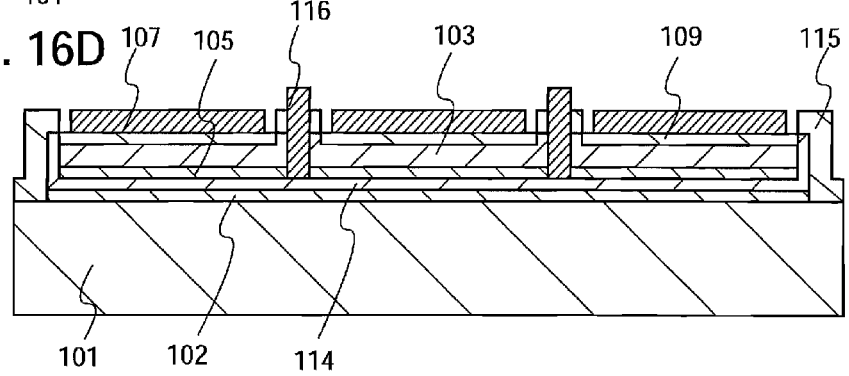

PHOTOVOLTAIC DEVICE AND METHOD FOR MANUFACTURING THE SAME

TECHNICAL FIELD

The present invention relates to photovoltaic devices using single crystal semiconductors or polycrystalline semiconductors and a method for manufacturing the photovoltaic device. In specific, the present invention relates to photovoltaic devices in which single crystal layers or polycrystalline semiconductor layers are provided over support substrates having insulating properties.

BACKGROUND ART

As a measure against global warming, solar photovoltaic systems are being introduced in many places. The total production of photovoltaic devices in the world in 2005 was 1,759 MW, which is an increase by 147% over the previous fiscal year. At present, the most popular photovoltaic device is crystal photovoltaic devices, and photovoltaic devices using single crystal silicon or polycrystalline silicon account for the large part of the production. A photovoltaic device which is called a crystal photovoltaic device uses a silicon wafer as a substrate, which is obtained by slicing a large silicon ingot which is manufactured.

It is estimated that, in a crystal photovoltaic device using single crystal silicon or polycrystalline silicon, a thickness of the silicon wafer is sufficient to be about 10 µm for generating photoelectromotive force. However, a silicon wafer cut out from a silicon ingot has a thickness of about 200 to 500 µm. This means that only about 5% of a silicon wafer which is used in a photovoltaic device contributes to photoelectric conversion.

As production of photovoltaic devices increases, shortage in supply of polycrystalline silicon, which is a material of silicon (a silicon ingot), and steep price rise of silicon wafers become problems in industry. The production of polycrystalline silicon including polycrystalline silicon for semiconductors in the world in 2006 was about 37 thousand tons, 11 thousand tons of which is demanded for solar sells. Production of solar sells is increasing year by year and the demand has already been tight. In order to increase production capacity of polycrystalline silicon, a large investment is needed and it is difficult to ensure the production which corresponds to the demand. Therefore, it is expected that shortage of silicon wafer supply will continue.

Here, as another mode of a photovoltaic device using a single crystal semiconductor substrate, a photovoltaic device using a single crystal semiconductor layer formed into a slice is given. For example, Patent Document 2 (Patent Document 2: Japanese Published Patent Application No. H10-335683) discloses a tandem solar cell in which hydrogen ions are implanted into a single crystal silicon substrate, a single crystal silicon layer which is separated from the single crystal silicon substrate in a layer shape is disposed over a support substrate in order to lower the cost and save resources while maintaining high conversion efficiency. In this tandem solar cell, a single crystal semiconductor layer and a substrate are bonded to each other with a conductive paste.

Further, an attempt to directly form the crystalline semiconductor layer over a substrate has been conventionally made. For example, a method for manufacturing a silicon thin film photovoltaic device in which a crystalline silicon film is deposited over a substrate by using a VHF which is higher than 27 MHz and pulse modulating the VHF, is developed (see Patent Document 1: Japanese Published Patent Application No. 2005-50905). Further, a technique for controlling plasma treatment conditions to optimize crystal grains and a concentration of a dopant into a crystal grain boundary when a thin film polycrystalline silicon film is formed by a plasma CVD method over a special electrode called a texture electrode which has a minute unevenness on its surface, is disclosed (see Patent Document 3: Japanese Published Patent Application No. 2004-14958).

DISCLOSURE OF INVENTION

However, in a crystal thin film silicon photovoltaic device, there is a problem in that crystal quality is inferior and conversion efficiency is low compared to single crystal silicon. It is necessary that a polycrystalline silicon film or a microcrystal silicon film is deposited to a thickness greater than or equal to 1 µm by a chemical vapor deposition method, resulting in a problem of inferior productivity. In a chemical vapor deposition method, it is necessary that a large amount of a material gas flows for film formation. However, only several percent of the material gas is utilized for growth of a film and the rest is ejected. That is, in a chemical vapor deposition method, there is a problem in that effective utilization efficiency of a material gas is low; accordingly, a sufficient advantage in a crystal thin film silicon photovoltaic device has not been found in terms of a cost of manufacturing. Further, as a semiconductor substrate in a crystal photovoltaic device, a semiconductor substrate a thickness of which is ten times or more a thickness needed for photoelectric conversion is used. Thus, an expensive wafer is wasted.

Further, in a method for bonding a single crystal semiconductor layer which is formed into a slice to a support substrate with a conductive paste, there is a problem such that bond strength cannot be maintained for a long time. In particular, in a condition in which a photovoltaic device is exposed to direct sunlight, there is a problem such that an organic material contained in a conductive paste is modified and bond strength is lowered. In addition, there is a problem of reliability such that a conductive material (e.g., silver) in the conductive paste is diffused into the single crystal semiconductor layer, which deteriorates photoelectric conversion characteristics of a semiconductor.

In view of the foregoing, it is an object of the present invention to attain thinning of a photoelectric conversion layer formed from a single crystal semiconductor or a polycrystalline semiconductor. It is another object of the present invention to efficiently use a silicon semiconductor material which is necessary for photoelectric conversion. It is still another object of the present invention to improve reliability of a photovoltaic device.

One aspect of the present invention is a photovoltaic device having a single crystal semiconductor layer provided over a substrate having an insulating surface or an insulating substrate, in which a so-called SOI structure is provided where the single crystal semiconductor layer is bonded to the substrate with an insulating layer interposed therebetween. In the photovoltaic device, the single crystal semiconductor layer has a function of photoelectric conversion. The single crystal semiconductor layer is obtained by separation of an outer layer portion of a single crystal semiconductor substrate and transfer of the portion to the substrate having an insulating surface or the insulating substrate. In the present invention, a polycrystalline semiconductor can be used instead of a single crystal semiconductor.

The single crystal semiconductor layer and the substrate having an insulating surface or the insulating substrate are bonded to each other with a layer which has a smooth surface and forms a hydrophilic surface interposed therebetween. In this specification, this layer is also referred to as "a bonding layer" for the sake of convenience. At an initial stage of bond formation, Van der Waals forces or hydrogen bonding is utilized for force for bonding this bonding layer and the single crystal semiconductor layer, or the bonding layer and the substrate having an insulating surface or the insulating substrate. Thermal treatment is performed subsequent to the initial stage of bond formation, whereby a bonding portion is changed to have a covalent bond and thus bonding force is further increased.

In bonding the substrate to the single crystal semiconductor layer, as a bonding layer, a silicon oxide film is preferably used which is formed using organic silane as a material on one or both surfaces that are to form a bond. Examples of organic silane that can be used include silicon-containing compounds, such as tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

The single crystal semiconductor layer provided over the substrate having an insulating substrate or the insulating substrate is obtained by forming a region into which ions of hydrogen, ions of an inert gas typified by helium, or ions of halogen typified by fluorine are introduced at high concentration (hereinafter, also referred to as "a separation layer") in a single crystal semiconductor substrate, and cleaving the region. For example, when the separation layer is formed by addition of hydrogen ions to the single crystal semiconductor substrate, it is preferable to introduce one kind of ions or plural kinds of ions of different masses each consisting of the same atom. In specific, the introduction is preferably performed in the state where $H^+$, $H_2^+$, and $H_3^+$ ions are included as hydrogen ions and the proportion of $H_3^+$ ions is increased. By the introduction of ions with a large number of atoms, a dosage can be substantially increased and thus productivity can be improved.

By using a single crystal semiconductor layer separated from a single crystal semiconductor substrate, a photovoltaic device excellent in photoelectric conversion characteristics can be obtained. By provision of a bonding layer between a substrate having an insulating surface or an insulating substrate and a single crystal semiconductor layer separated from a single crystal semiconductor substrate, the two can be strongly bonded to each other. With the use of a specific silicon oxide film as the bonding layer, a bond can be formed at a temperature less than or equal to 700° C. Accordingly, even in the case of using a substrate with an upper temperature limit of 700° C. or lower, such as a glass substrate, a single crystal semiconductor layer in which a bonding portion has high bond strength can be provided over a substrate of glass or the like.

As a substrate to which the single crystal semiconductor layer is fixed, it is possible to use any of a variety of glass substrates that are used in the electronics industry and that are referred to as non-alkali glass substrates, such as aluminosilicate glass substrates, aluminoborosilicate glass substrates, and barium borosilicate glass substrates. In other words, a single crystal semiconductor layer can be formed over a substrate that is longer than one meter on each side. With the use of such a large-area substrate, a photovoltaic device excellent in photoelectric conversion characteristics can be obtained.

BRIEF DESCRIPTION OF DRAWINGS

In the accompanying drawings:

FIG. 9 is a plan view illustrating manufacturing steps of a solar photovoltaic module relating to an embodiment mode;

FIGS. 16A to 16D are cross-sectional views illustrating manufacturing steps of a photovoltaic module relating to an embodiment mode.

BEST MODE FOR CARRYING OUT THE INVENTION

Embodiment Mode

Figure 1A:
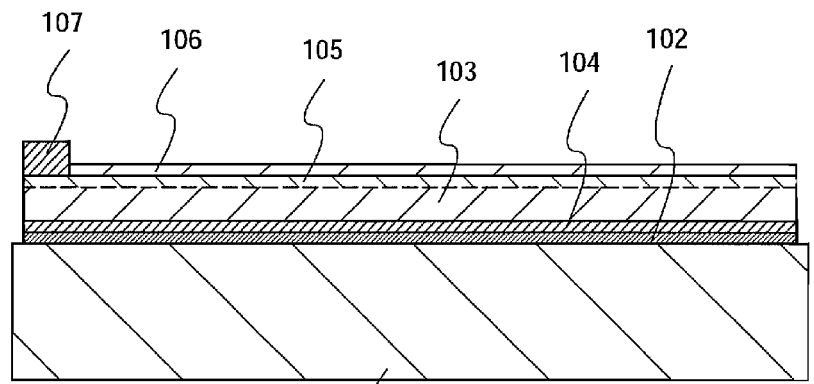
FIGS. 1A and 1B are views each showing a cross-sectional structure of a photovoltaic device in which a single crystal semiconductor layer over an insulating substrate is used as a photoelectric conversion layer.

An embodiment mode of the present invention will be described below with reference to the accompanying drawings. However, the present invention is not limited to the description given below, and it will be readily apparent to those skilled in the art that various changes and modifications in modes and details thereof can be made without departing from the purpose and scope of the present invention. Therefore, the present invention should not be interpreted as being limited to the description of the embodiment mode given below. Note that in structures of the present invention which are described below, like reference numerals are used for like portions throughout different drawings.

(Structure of Photovoltaic Device)

FIG. 1A shows a cross-sectional structure of a photovoltaic device in which a substrate 101 is provided with a semiconductor layer 103. The substrate 101 is a substrate having an insulating surface or an insulating substrate, and any of a variety of glass substrates that are used in the electronics industry, such as aluminosilicate glass substrates, aluminoborosilicate glass substrates, and barium borosilicate glass substrates, can be used. Alternatively, a quartz glass substrate or a semiconductor substrate such as a silicon wafer can be used. A semiconductor material such as silicon, germanium, gallium arsenide, or indium phosphide which can be separated from a single crystal semiconductor substrate or a polycrystalline semiconductor substrate can be used for the semiconductor layer 103. Preferably, single crystal silicon is used for the semiconductor layer 103.

Between the substrate 101 and the semiconductor layer 103, a bonding layer 102 which has a flat surface and forms a hydrophilic surface is provided. A silicon oxide film is suitable for use as the bonding layer 102. As the bonding layer 102, a silicon oxide film formed by a chemical vapor deposition method with the use of an organic silane gas is particularly preferable. Examples of organic silane that can be used include silicon-containing compounds such as tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

The bonding layer 102 which has a smooth surface and forms a hydrophilic surface is provided to a thickness of 5 to 500 nm. This thickness is effective for smoothing a surface of the bonding layer 102 and for relieving distortion due to stress between the semiconductor layer 103 and the substrate 101.

In FIG. 1A, the bonding layer 102 is provided on the semiconductor layer 103 side and is disposed in contact with a surface of the substrate 101, whereby bonding can be performed even at room temperature. In order to form a stronger bond, the substrate 101 and the semiconductor layer 103 may be pressed. Further, when thermal treatment is performed on the substrate 101 with which the bonding layer 102 formed on the semiconductor layer 103 is disposed in contact, a strong bond can be formed. In this case, the thermal treatment may be performed under pressure.

To bond the substrate 101 and the bonding layer 102 to each other at low temperature, it is necessary to clean surfaces thereof. When the substrate 101 and the bonding layer 102 surfaces of which are cleaned are disposed in contact with each other, a bond is formed by attraction between the surfaces. In this case, it is preferable to perform treatment in which a hydroxy group is attached to a bond formation surface of one or each of the substrate 101 and the bonding layer 102. By oxygen plasma treatment or ozone treatment, the surface of the substrate 101 can be made hydrophilic. It is considered that this phenomenon occurs because a surface which is subjected to oxygen plasma treatment or ozone treatment is activated and a hydroxy group is attached. That is, in the case of performing treatment in which a surface of the substrate 101 is made hydrophilic, a bond is formed by hydrogen bonding by the action of a hydroxy group on the surface. To increase strength of a bond formed at room temperature, it is preferable to perform thermal treatment.

As treatment for bonding the substrate 101 and the bonding layer 102 to each other at low temperature, surfaces to form a bond may be cleaned by being irradiated with an ion beam using an inert gas such as argon. By the irradiation with an ion beam, a dangling bond is exposed on a surface of the substrate 101 or the bonding layer 102 and extremely active surfaces are formed. When surfaces which are thusly activated are disposed in contact with each other, a bond can be formed even at low temperature. A method for forming a bond by activation of surfaces is preferably carried out in vacuum because it is necessary for the surfaces to be highly cleaned.

The semiconductor layer 103 is obtained by separating a thin slice from a single crystal semiconductor substrate. For example, the semiconductor layer 103 can be formed by a hydrogen ion implantation separation method in which hydrogen ions are introduced into a single crystal semiconductor substrate at a predetermined depth at high concentration, and then, thermal treatment is performed and a single crystal silicon layer in an outer layer is separated. Alternatively, a method may be used in which after single crystal silicon is epitaxially grown over porous silicon, cleavage is performed by water-jetting so that a porous silicon layer is separated. A thickness of the semiconductor layer 103 is set to 0.1 to 10 µm. The thickness of the semiconductor layer 103 is sufficient for absorption of sunlight. Further, the thickness thereof is suitable for extracting a photogenerated carrier, which flows through the semiconductor layer 103, through an electrode before a photogenerated carrier is annihilated by recombination.

A first impurity semiconductor layer 105 is provided in the semiconductor layer 103. An impurity element imparting p-type or n-type conductivity is added to the first impurity semiconductor layer 105. An element belonging to Group 13 in the periodic table, such as boron, is used as a p-type impurity, and an element belonging to Group 15 in the periodic table, such as phosphorus or arsenic, is used as an n-type impurity. An impurity element can be added by an ion implantation method or an ion doping method. In this specification, an ion implantation method indicates a method in which an ionized gas which had been subjected to mass separation is implanted into a semiconductor, and an ion doping method indicates a method in which an ionized gas which is not subjected to mass separation is introduced to a semiconductor. For example, in the case where the semiconductor layer 103 has p-type conductivity, phosphorus or arsenic is added to the first impurity semiconductor layer 105, so that the first impurity semiconductor layer 105 has n-type conductivity. In the case where the semiconductor layer 103 has n-type conductivity, boron is added to the first impurity semiconductor layer 105, so that the first impurity semiconductor layer 105 has p-type conductivity.

A first electrode 104 is provided between the semiconductor layer 103 and the bonding layer 102. In the case where a plane of incidence is on the first impurity semiconductor layer 105 side, the first electrode 104 is formed from metal such as aluminum, nickel, or silver. In contrast, in the case where a plane of incidence is on the substrate 101 side, the first electrode 104 is formed of a transparent electrode of indium tin oxide or the like.

A second electrode 107 is provided over the first impurity semiconductor layer 105. In the case where a plane of incidence is on the first impurity semiconductor layer 105 side, the second electrode 107 is formed of an electrode which is formed from aluminum, silver, or the like and shaped into a comb shape, or the second electrode 107 is formed of a transparent electrode of indium tin oxide or the like. In this structure, a protective film 106 is preferably provided over the first impurity semiconductor layer 105. The protective film 106 is preferably formed of a silicon nitride film. Further, a silicon nitride film and a magnesium fluoride film may be stacked so that a function as an anti-reflective film may be added. In contrast, in the case where a plane of incidence is on the substrate 101 side, the second electrode 107 may be formed from metal such as aluminum.

Figure 1B:
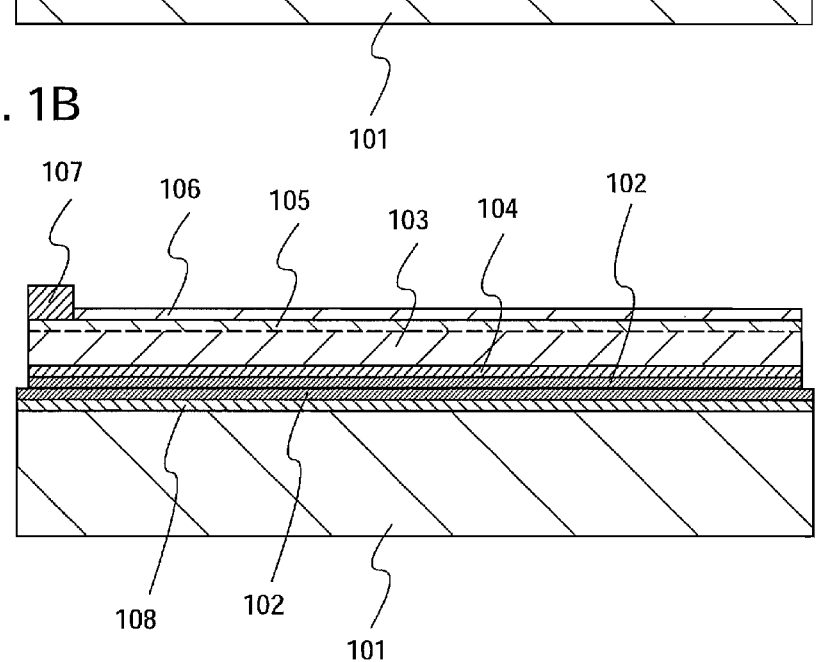

FIG. 1B shows a structure of a photovoltaic device in which the substrate 101 is provided with a barrier layer 108 and the bonding layer 102. When the barrier layer 108 is provided, the semiconductor layer 103 can be prevented from being contaminated by diffusion of an impurity from the substrate 101. That is, an impurity such as a movable ion like an alkali metal or an alkaline earth metal can be prevented from being diffused from the substrate 101 in the semiconductor layer 103. The barrier layer 108 is preferably formed of a dense insulating film of a silicon nitride, an aluminum nitride, or the like. In this case, the bonding layer 102 is preferably provided over the barrier layer 108 provided over the substrate 101. When the bonding layer 102 is also provided on the substrate 101 side, a favorable bond can be formed.

Figure 2A:
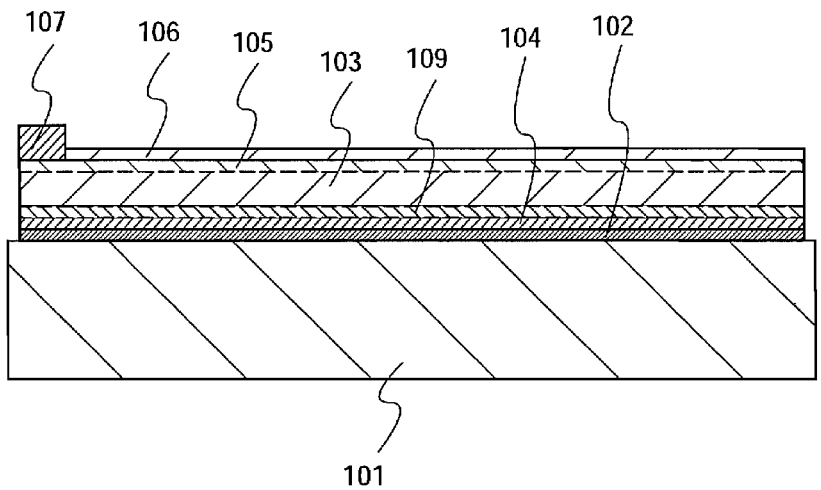
FIGS. 2A and 2B are views each showing a cross-sectional structure of a photovoltaic device in which a single crystal semiconductor layer over an insulating substrate is used as a photoelectric conversion layer.

FIG. 2A shows a structure of a photovoltaic device in which a second impurity semiconductor layer 109 is provided in the semiconductor layer 103. The second impurity semiconductor layer 109 is provided on the side opposite to a first impurity semiconductor layer 105 in the semiconductor layer 103. The first impurity semiconductor layer 105 and the second impurity semiconductor layer 109 are formed to have different conductivity types. For example, in the case where the first impurity semiconductor layer 105 has n-type conductivity, the second impurity semiconductor layer 109 is formed to have p-type conductivity. At this time, in the case where a plane of incidence is on the first impurity semiconductor layer 105 side, an internal electric field is generated by the second impurity semiconductor layer 109 on the opposite side. This electric field is called a back surface field (BSF). Such a structure is suitable for improving external quantum efficiency of a photogenerated carrier. Such a structure effectively functions in a photovoltaic device in which a photoelectric conversion layer is formed of the semiconductor layer 103 with a thickness of 0.1 to 10 μm. Other parts are similar to those of FIG. 1A.

Figure 2B:
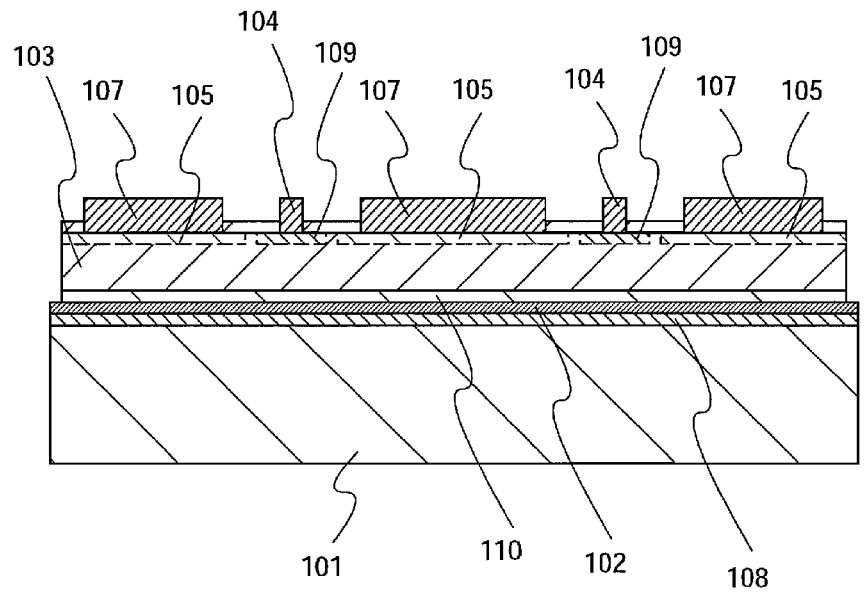

FIG. 2B shows a structure in which the first impurity semiconductor layer 105 and the second impurity semiconductor layer 109 are provided on one surface side of the semiconductor layer 103 and a silicon oxide layer 110 is provided on the opposite surface side thereof. The silicon oxide layer 110 is formed from a silicon oxide which is formed using a silane gas by thermal oxidation or a chemical vapor deposition method. The semiconductor layer 103 is bonded to the substrate 101 using the silicon oxide layer 110 and the bonding layer 102 formed over the substrate 101. In this structure, a plane of incidence is preferably set on the substrate 101 side. Since an electrode which shields light is not formed on the plane of incidence side, an effective light-receiving area can be enlarged.

As above, structures of a photovoltaic device using a semiconductor layer 103 bonded over a substrate 101 are described with reference to FIGS. 1A to 2B. However, this mode is not limited to the above-described structures and can be implemented by freely combining components in the structures. Further, a polycrystalline semiconductor layer can be used instead of a single crystal semiconductor layer.

(Manufacturing Steps 1 of Photovoltaic Device)

A method for manufacturing a photovoltaic device, in which a thin single crystal semiconductor layer is separated from a single crystal semiconductor substrate and the single crystal semiconductor layer is transferred over a substrate having an insulating surface or an insulating substrate, is described with reference to the drawings.

Figure 3:
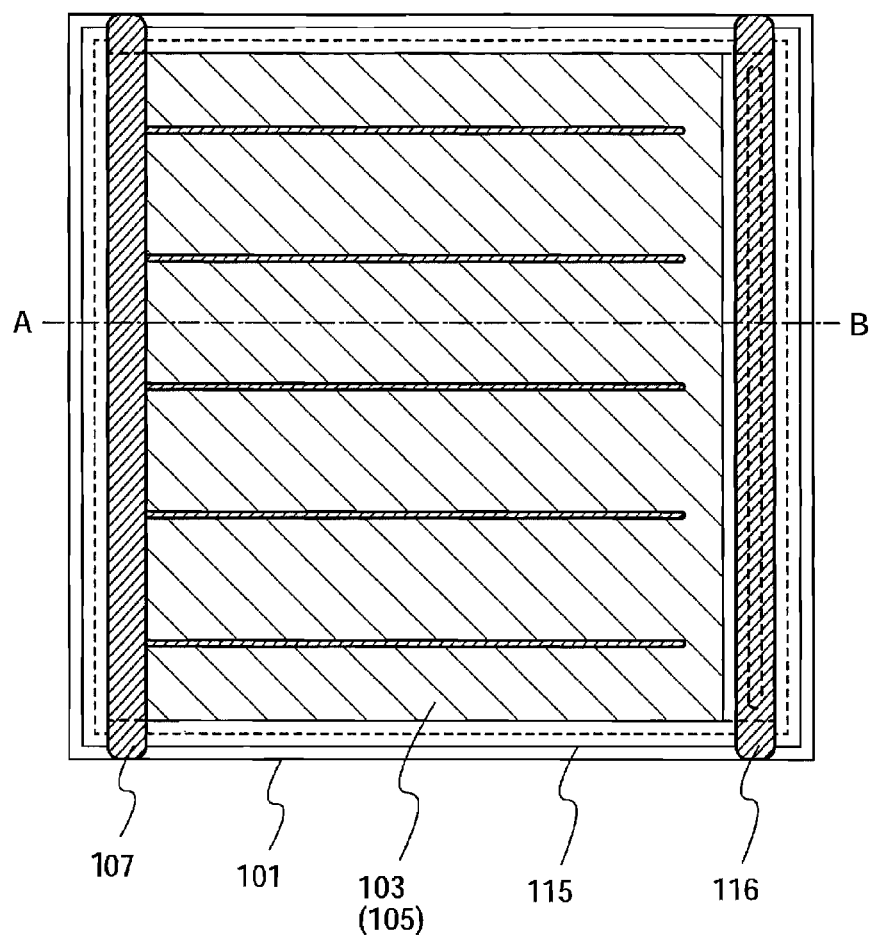
FIG. 3 is a plan view of a photovoltaic device relating to an embodiment mode.

FIG. 3 is a plan view of a photovoltaic device relating to this mode. This photovoltaic device has a structure in which light is incident on the semiconductor layer 103 bonded over the substrate 101. In a peripheral portion of the substrate 101, an insulating layer 115 provided with an opening is provided over the semiconductor layer 103. The first impurity semiconductor layer 105 is provided in the semiconductor layer 103. Over the first impurity semiconductor layer 105, a second electrode 107 having a comb shape is formed. An extraction electrode 116 is electrically connected to a first electrode through a contact hole penetrating the insulating layer 115 and the semiconductor layer 103.

Next, steps of manufacturing a photovoltaic device are described with reference to cross-sectional views corresponding to a line A-B in FIG. 3.

Figure 4A:
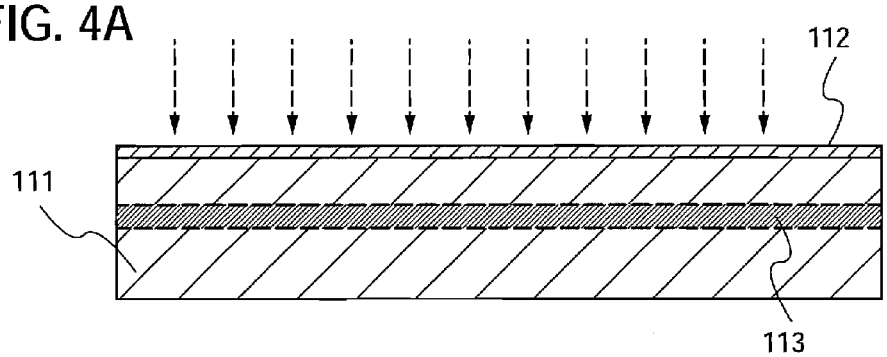
FIGS. 4A to 4D are cross-sectional views illustrating manufacturing steps of a photovoltaic device relating to an embodiment mode.

FIG. 4A shows a step in which a surface protective film 112 is formed over a single crystal semiconductor substrate 111 and a separation layer 113 is formed by an ion doping method. The single crystal semiconductor substrate 111 is cleaned, over a surface of which the surface protective film 112 is formed. A typical example of the single crystal semiconductor substrate 111 is a single crystal silicon substrate. For example, as the single crystal semiconductor substrate 111, a silicon wafer a surface of which is mirror-polished is used. The surface protective film 112 is preferably formed from a silicon oxide or a silicon nitride, and the surface protective film 112 is formed by a chemical vapor deposition method. The surface protective film 112 is preferably provided in order to protect a surface of the single crystal semiconductor substrate 111 from being roughened by ion doping. The surface protective film 112 is provided to have a thickness of 50 to 200 nm. A surface of the surface protective film 112 is irradiated with ions accelerated by an electric field, so that the separation layer 113 is formed in the single crystal semiconductor substrate 111 at a predetermined depth.

The distance from the surface of the single crystal semiconductor substrate 111 to the separation layer 113 is determined in consideration of a thickness of a semiconductor layer that is to be transferred to a support substrate. In a photovoltaic device, the thickness of the semiconductor layer 103 is set to be 0.1 to 10 μm. In order to form the separation layer 113 in a comparatively deep position from the surface of the single crystal semiconductor substrate 111, ions are accelerated by high voltage of 80 kV or more. Ions are preferably incident on a principal plane of the single crystal semiconductor substrate 111 at an approximately right angle. When ions are introduced into the single crystal semiconductor substrate 111, a channeling phenomenon may be positively utilized so that the ions may be deeply introduced into a deep position. For example, when a crystal plane orientation of the single crystal semiconductor substrate 111 is selected so that ions are perpendicularly incident on the crystal axis <100>, the ions can be deeply introduced.

The separation layer 113 is formed by doping of the single crystal semiconductor substrate 111 with ions of hydrogen, helium, or halogen typified by fluorine, at high concentration. In this case, one kind of ions or plural kinds of ions of different masses each consisting of the same atom, which are produced by subjecting a source gas selected from hydrogen, helium, or halogen to plasma excitation, are preferably introduced. In the case of introduced hydrogen ions, the hydrogen ions include $H^+$, $H_2^+$, and $H_3^+$ ions with a high proportion of $H_3^+$ ions; accordingly, introduction efficiency of hydrogen can be enhanced and thus time for doping can be shortened. By the introduction of hydrogen ions with a large number of atoms, dangling bonds of silicon are formed in the separation layer 113 and the dangling bonds are terminated to form minute voids (microvoids). Since the minute voids can include hydrogen, the semiconductor layer can be easily separated even by thermal treatment at low temperature.

Figure 4B:
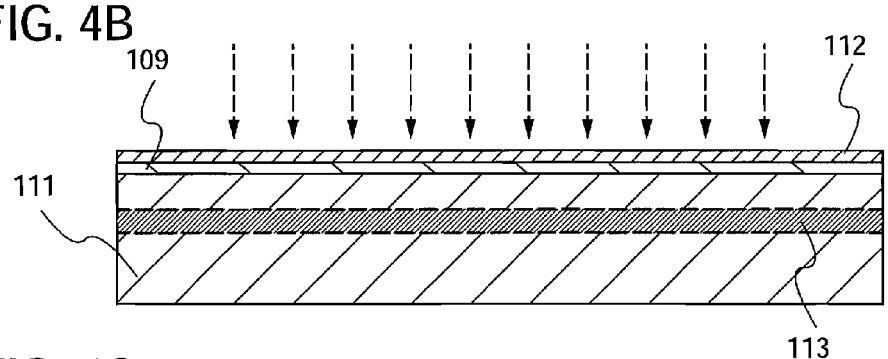

FIG. 4B shows a step of forming a second impurity semiconductor layer 109 over the single crystal semiconductor substrate 111. The second impurity semiconductor layer 109 is formed by doping of a region of the single crystal semiconductor substrate 111 at a shallow depth with boron as an impurity element imparting p-type conductivity. In the photovoltaic device of this mode, the second impurity semiconductor layer 109 is disposed on the side opposite to the plane of incidence, so that a back surface field (BSF) is formed.

Figure 4C:
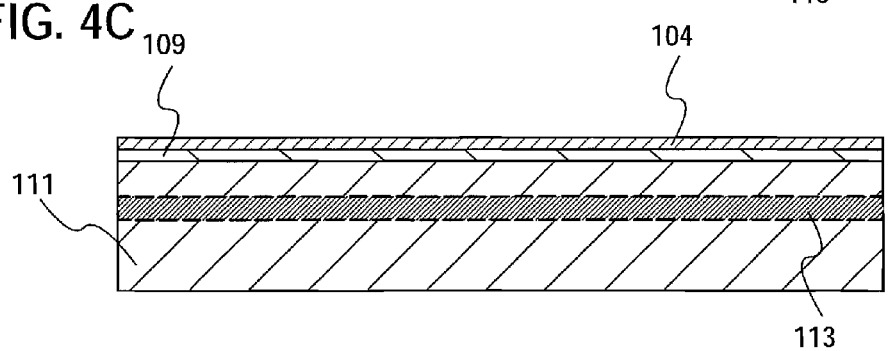

FIG. 4C shows a step of forming a first electrode 104 over the second impurity semiconductor layer 109. The first electrode 104 is formed from metal such as aluminum, nickel, or silver. The first electrode 104 is formed by a vacuum deposition method or a sputtering method so that a surface thereof is flattened.

Figure 4D:
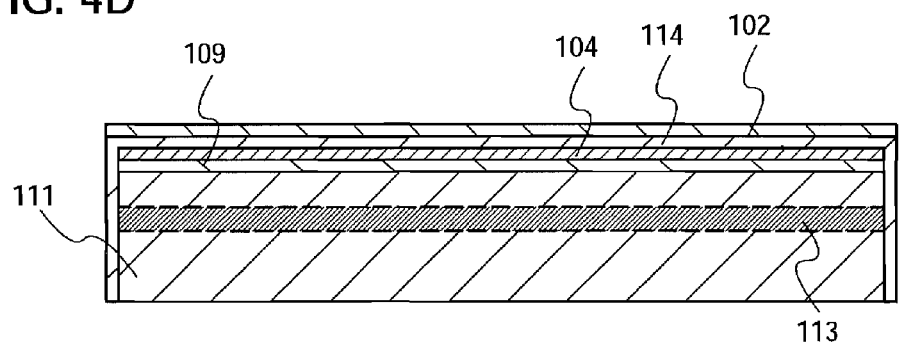

FIG. 4D shows a step in which a silicon nitride layer 114 which covers the single crystal semiconductor substrate 111 is provided over the first electrode 104 and the bonding layer 102 is further formed. The silicon nitride layer 114 is preferably provided in order to prevent impurity contamination. Owing to the silicon nitride layer 114, the semiconductor layer can be prevented from being contaminated by diffusion of an impurity such as a movable ion or moisture. Further, the silicon nitride layer 114 is preferably provided in order to prevent the first electrode 104 from being oxidized in forming the bonding layer 102.

The bonding layer 102 is formed of a silicon oxide film. As the silicon oxide film, a silicon oxide film formed by a chemical vapor deposition method with the use of an organic silane gas as described above is preferable. Alternatively, a silicon oxide film formed by a chemical vapor deposition method with the use of a silane gas can be used. Film formation by a chemical vapor deposition method is performed at a film formation temperature less than or equal to 350° C., for example, as a temperature at which degassing does not occur in the separation layer 113 formed in the single crystal semiconductor substrate. In contrast, thermal treatment for separation of the semiconductor layer from the single crystal semiconductor substrate 111 is performed at a thermal treatment temperature higher than the film formation temperature.

Figure 5A:
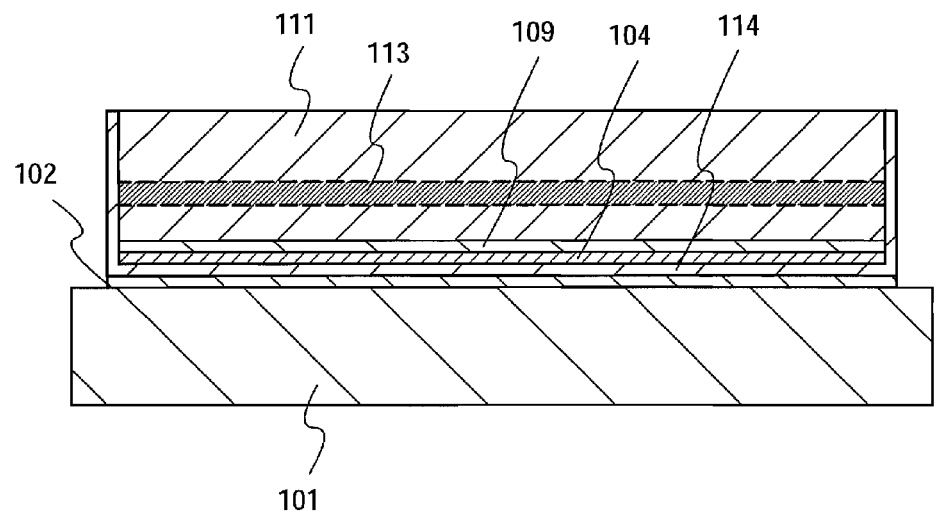
FIGS. 5A and 5B are cross-sectional views illustrating manufacturing steps of a photovoltaic device relating to an embodiment mode.

FIG. 5A shows a step in which the substrate 101 is disposed in contact with a surface of the bonding layer 102 which is formed on the single crystal semiconductor substrate 111, to bond the two to each other. Surfaces which are to form a bond are cleaned sufficiently. Then, the substrate 101 and the bonding layer 102 are disposed in contact with each other, whereby a bond is formed therebetween. This bond is formed by the action of hydrogen bonding as described above. By pressing the substrate 101 and the single crystal semiconductor substrate 111 against each other, a bond can be formed further reliably.

In order to form a favorable bond which forms good contact, a surface/surfaces of the substrate 101 and/or the bonding layer 102 may be activated. For example, the surface which is to form a bond is irradiated with an atomic beam or an ion beam. When an atomic beam or an ion beam is used, an inert gas neutral atom beam or an inert gas ion beam of argon or the like can be used. Alternatively, plasma irradiation or radical treatment is performed on a surface that is to form a bond. Such surface treatment makes it easy to form a bond between different kinds of materials even at a temperature of 200 to 400° C.

After the substrate 101 and the single crystal semiconductor substrate 111 are bonded to each other with the bonding layer 102 interposed therebetween, it is preferable that heat treatment or pressure treatment be performed. Heat treatment or pressure treatment makes it possible to increase bond strength. The heat treatment is preferably performed at a temperature equal to or lower than the upper temperature limit of the substrate 101. The pressure treatment is performed so that pressure is applied in a direction perpendicular to the bonding surface, in consideration of the pressure resistance of the substrate 101 and the single crystal semiconductor substrate 111.

Figure 5B:
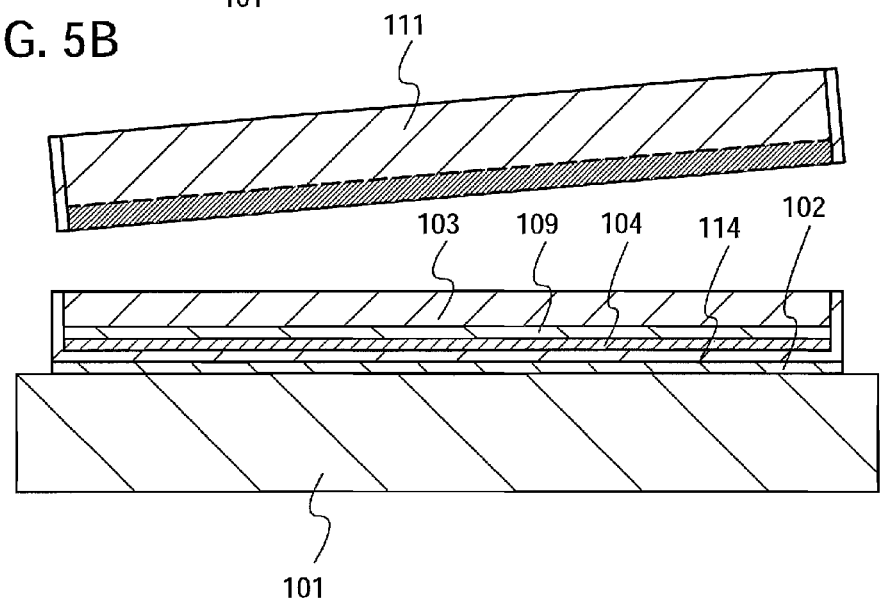

FIG. 5B shows a step in which after the substrate 101 and the single crystal semiconductor substrate 111 are bonded together, thermal treatment is performed to separate the single crystal semiconductor substrate 111 from the substrate 101 with the separation layer 113 used as a cleavage plane. The thermal treatment is preferably performed at a temperature ranging from the temperature at which the bonding layer 102 is formed to the upper temperature limit of the substrate 101. When the thermal treatment is performed at, for example, 400 to 600° C., a change occurs in the volume of minute voids formed in the separation layer 113, which enables separation of the single crystal semiconductor substrate 111 with the semiconductor layer 103 left over the substrate 101.

Figure 6A:
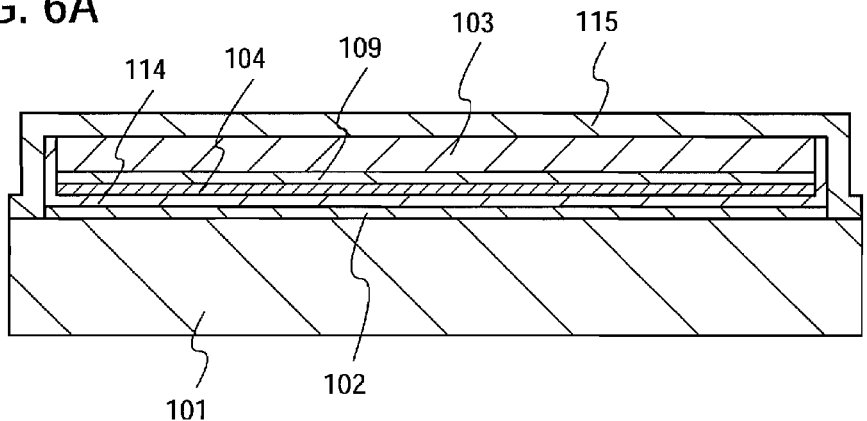
FIGS. 6A to 6C are cross-sectional views illustrating manufacturing steps of a photovoltaic device relating to an embodiment mode.

FIG. 6A shows a step in which the insulating layer 115 is formed over the semiconductor layer 103 bonded to the substrate 101. As the insulating layer 115, a silicon nitride film or a silicon oxide film is preferably formed by a chemical vapor deposition method.

Figure 6B:
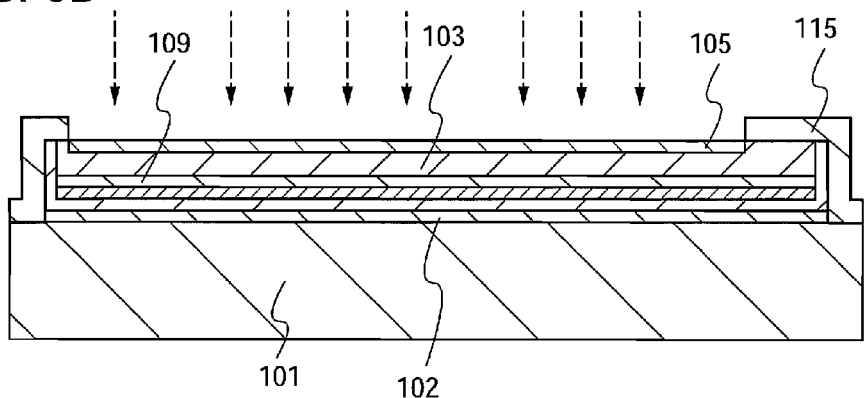

FIG. 6B shows a step in which an opening is formed in the insulating layer 115 and phosphorus or arsenic which is an n-type impurity element is added from the opening to form the first impurity semiconductor layer 105. The first impurity semiconductor layer 105 serves as a plane of incidence.

Figure 6C:
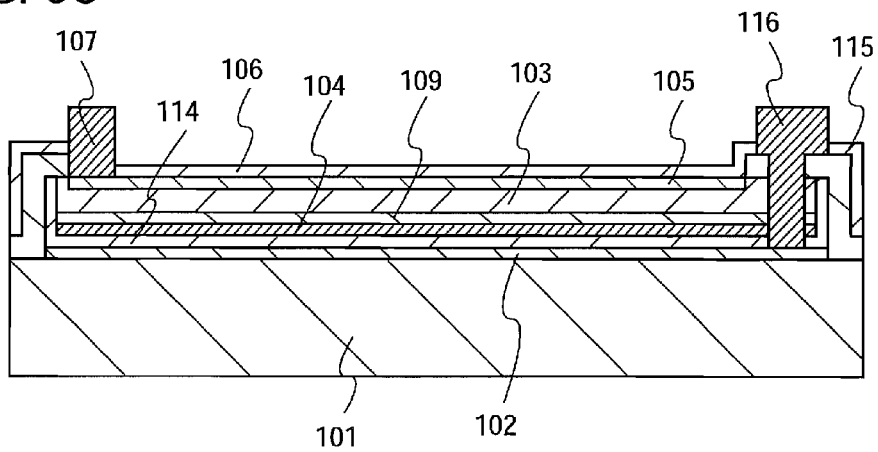

FIG. 6C shows a step in which after a silicon nitride film and a magnesium fluoride film are formed as the protective film 106, the second electrode 107 and the extraction electrode 116 connected to the first electrode 104 are formed. The extraction electrode 116 is formed after a contact hole penetrating the semiconductor layer 103 is formed. The second electrode 107 and the extraction electrode 116 may be formed from aluminum, silver, lead-tin (solder), or the like. For example, the second electrode 107 and the extraction electrode 116 can be formed using a silver paste by a screen printing method.

In such a manner, the photovoltaic device shown in FIG. 3 can be manufactured. According to this mode, a single crystal photovoltaic device can be manufactured at a process temperature less than or equal to 700° C. (preferably, less than or equal to 500° C.). In other words, a high-efficiency photovoltaic device provided with a single crystal semiconductor layer can be manufactured over a large-area glass substrate with an upper temperature limit of 700° C. or lower. The single crystal semiconductor layer is obtained by separation of an outer layer of a single crystal semiconductor substrate. Since the single crystal semiconductor substrate can be reused, resources can be effectively used.

(Manufacturing Steps 2 of a Photovoltaic Device)

This mode describes a method for manufacturing a photovoltaic device, in which a light-transmitting substrate serves as a light receiving plane. In this mode, elements same as and elements having a common function to FIGS. 4A to 6C are denoted by the same reference numeral for explanation, and the repetitive explanation thereof is omitted.

Figure 13:
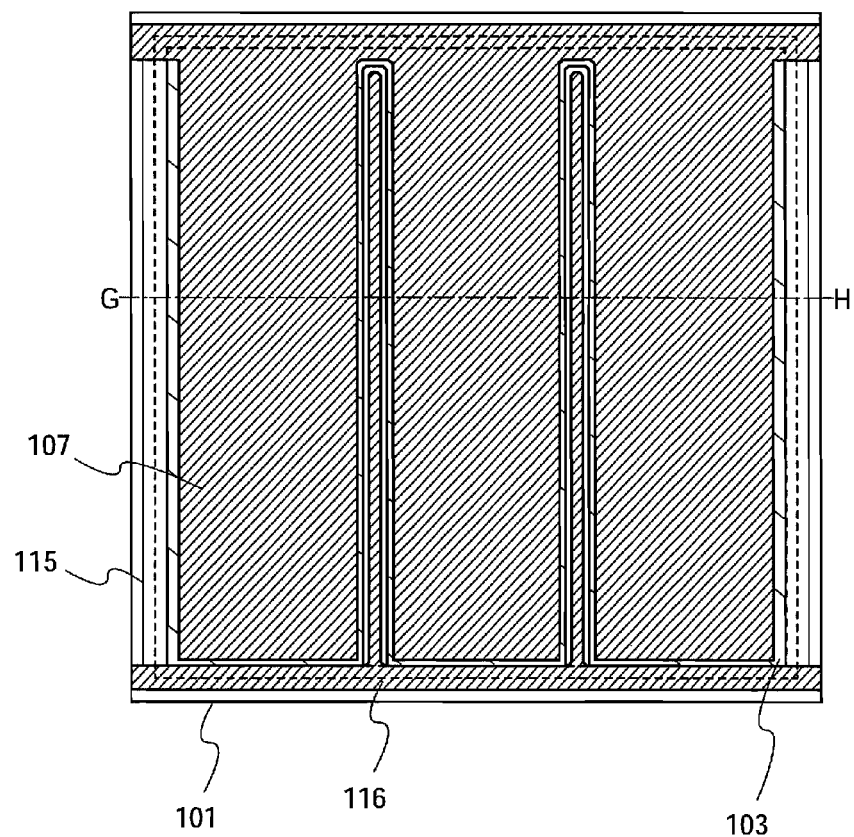
FIG. 13 is a plan view of a photovoltaic module relating to an embodiment mode.

FIG. 13 is a plan view of a photovoltaic device relating to this mode, which is seen from a surface opposite to the light receiving plane. This photovoltaic device has a structure in which light is incident on the semiconductor layer 103 bonded over the substrate 101, from the substrate 101 side. The extraction electrode 116 and the second electrode 107 are formed over the semiconductor layer 103. The extraction electrode 116 is structured so as to be connected to a first electrode on the substrate 101 side through a contact hole penetrating the semiconductor layer 103.

Next, steps of manufacturing this photovoltaic device are described with reference to cross-sectional views corresponding to a line G-H in FIG. 13.

Figure 14A:
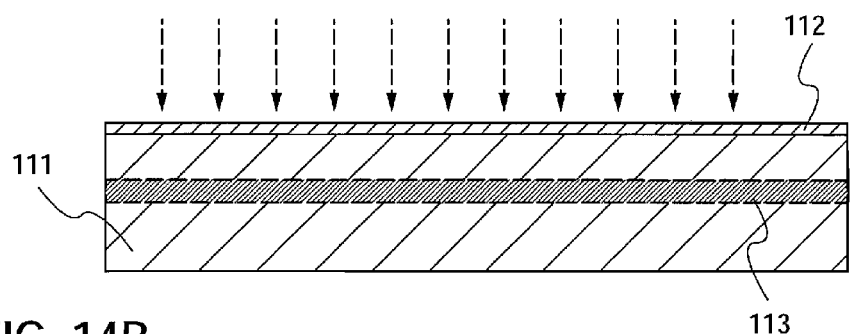
FIGS. 14A to 14C are cross-sectional views illustrating manufacturing steps of a photovoltaic module relating to an embodiment mode.

FIG. 14A shows a step in which a surface protective film 112 is formed over a single crystal semiconductor substrate 111 and a separation layer 113 is formed by an ion doping method.

Figure 14B:
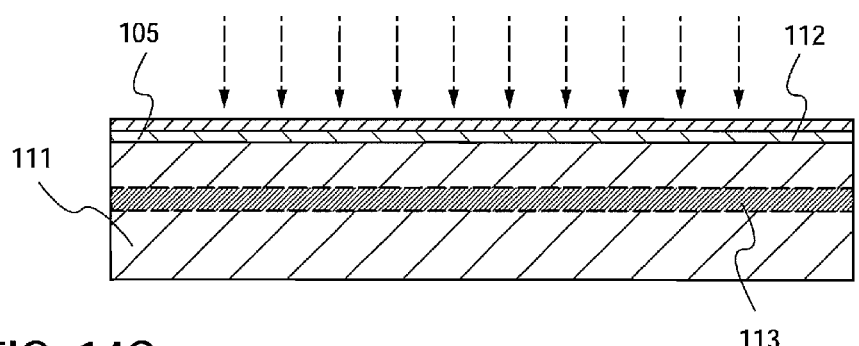

FIG. 14B shows a step of forming a first impurity semiconductor layer 105 over the single crystal semiconductor substrate 111. The first impurity semiconductor layer 105 is formed by doping of a region of the single crystal semiconductor substrate 111 at a shallow depth with phosphorus or arsenic as an impurity element imparting n-type conductivity.

Figure 14C:
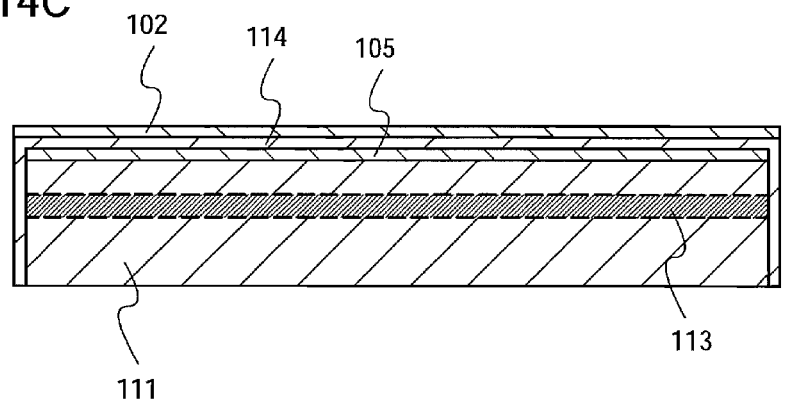

FIG. 14C shows a step in which a silicon nitride layer 114 which covers the single crystal semiconductor substrate 111 is provided over the first impurity semiconductor layer 105 and a bonding layer 102 is further formed.

Figure 15A:
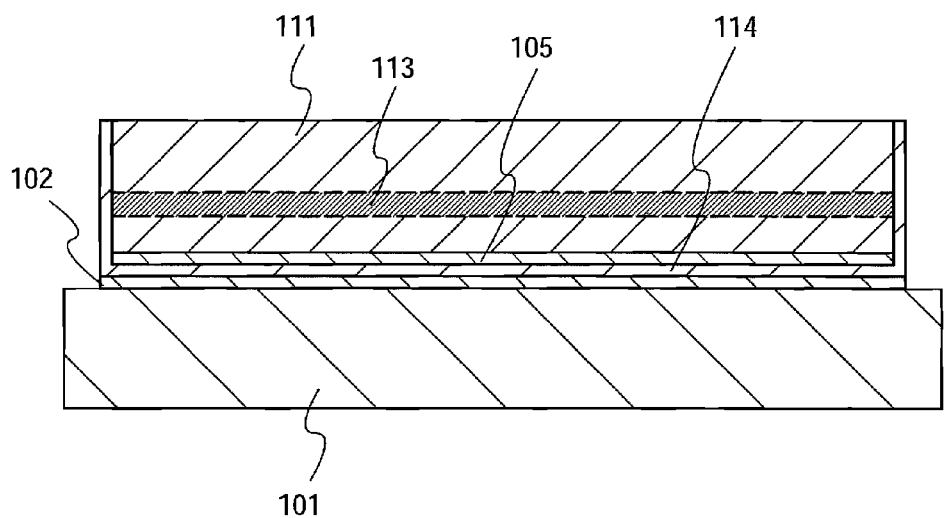
FIGS. 15A and 15B are cross-sectional views illustrating manufacturing steps of a photovoltaic module relating to an embodiment mode.

FIG. 15A shows a step in which the substrate 101 is disposed in contact with a surface of the bonding layer 102 formed on the single crystal semiconductor substrate 111, to bond the two to each other. Surfaces which are to form a bond are cleaned sufficiently. Then, the substrate 101 and the bonding layer 102 are disposed in contact with each other, whereby a bond is formed therebetween. After the substrate 101 and the single crystal semiconductor substrate 111 are bonded to each other with the bonding layer 102 interposed therebetween, it is preferable that heat treatment or pressure treatment be performed. Heat treatment or pressure treatment makes it possible to increase bond strength. The heat treatment is preferably performed at a temperature equal to or lower than the upper temperature limit of the substrate 101. The pressure treatment is performed so that pressure is applied in a direction perpendicular to the bonding surface, in consideration of the pressure resistance of the substrate 101 and the single crystal semiconductor substrate 111.

Figure 15B:
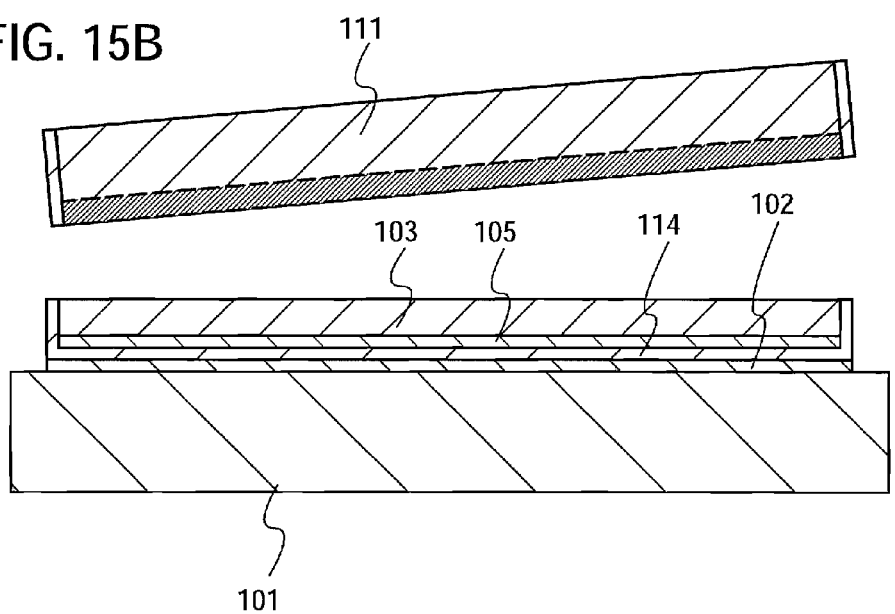

FIG. 15B shows a step in which after the substrate 101 and the single crystal semiconductor substrate 111 are bonded to each other, thermal treatment is performed to separate the single crystal semiconductor substrate 111 from the substrate 101 with the separation layer 113 used as a cleavage plane. The thermal treatment is preferably performed at a temperature ranging from the temperature at which the bonding layer 102 is formed to the upper temperature limit of the substrate 101. When the thermal treatment is performed at, for example, 400 to 600° C., a change occurs in the volume of minute voids formed in the separation layer 113, which enables separation of the single crystal semiconductor substrate 111 with the semiconductor layer 103 left over the substrate 101.

FIG. 16A shows a step in which the insulating layer 115 is formed over the semiconductor layer 103 bonded to the substrate 101. FIG. 16B shows a step in which an opening is formed in the insulating layer 115 and boron which is a p-type impurity element is added from the opening to form the second impurity semiconductor layer 109. The opening formed in the insulating layer 115 is processed so that the insulating layer which is left over the semiconductor layer 103 has a comp shape.

FIG. 16C shows a step in which a contact hole 117 is formed downward from the top of the insulating layer 115 which is left over the semiconductor layer 103. The contact hole 117 is formed in such a manner that the semiconductor layer 103 is irradiated with a condensed laser beam and processed.

FIG. 16D shows a step in which the second electrode 107 and the extraction electrode 116 connected to the first impurity semiconductor layer 105 are formed. The extraction electrode 116 is formed after the contact hole penetrating the semiconductor layer 103 is formed. The second electrode 107 and the extraction electrode 116 are formed from a metal material such as aluminum, silver, lead-tin (solder), or the like. For example, the second electrode 107 and the extraction electrode 116 can be formed using a silver paste by a screen printing method.

In such a manner, the photovoltaic device shown in FIG. 13 can be manufactured. According to this mode, a single crystal photovoltaic device can be manufactured at a process temperature less than or equal to 700° C. (preferably, less than or equal to 500° C.). In other words, a high-efficiency photovoltaic device provided with a single crystal semiconductor layer can be manufactured over a large-area glass substrate with an upper temperature limit of 700° C. or lower. The single crystal semiconductor layer is obtained by separation of an outer layer of a single crystal semiconductor substrate. Since the single crystal semiconductor substrate can be reused, resources can be effectively used.

(Method for Manufacturing Solar Photovoltaic Module)

This mode exemplifies a method for manufacturing a solar photovoltaic module by bonding of a single crystal semiconductor layer over a large-area substrate. Main part of steps of manufacturing a photovoltaic device used for a solar photovoltaic module are similar to those illustrated in FIGS. 4A to 6C.

Figure 7:
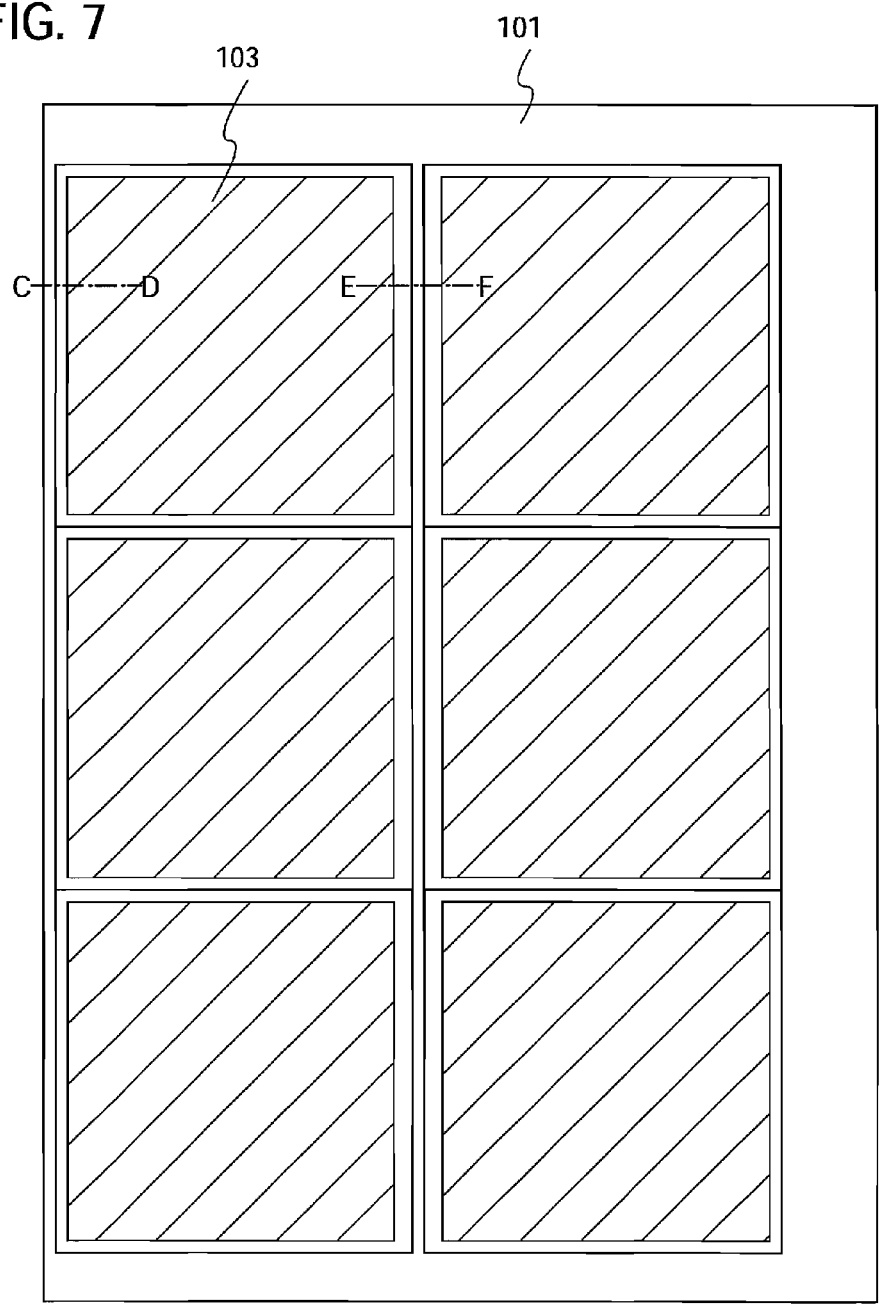
FIG. 7 is a plan view illustrating manufacturing steps of a solar photovoltaic module relating to an embodiment mode.
Figure 8A:
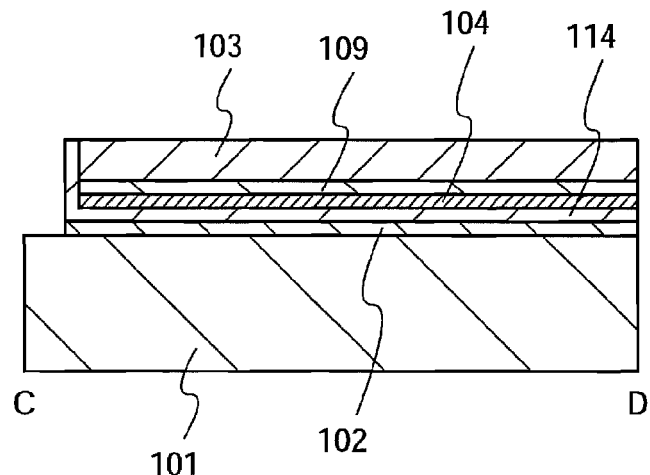
FIGS. 8A and 8B are cross-sectional views illustrating manufacturing steps of a solar photovoltaic module relating to an embodiment mode.
Figure 8B:
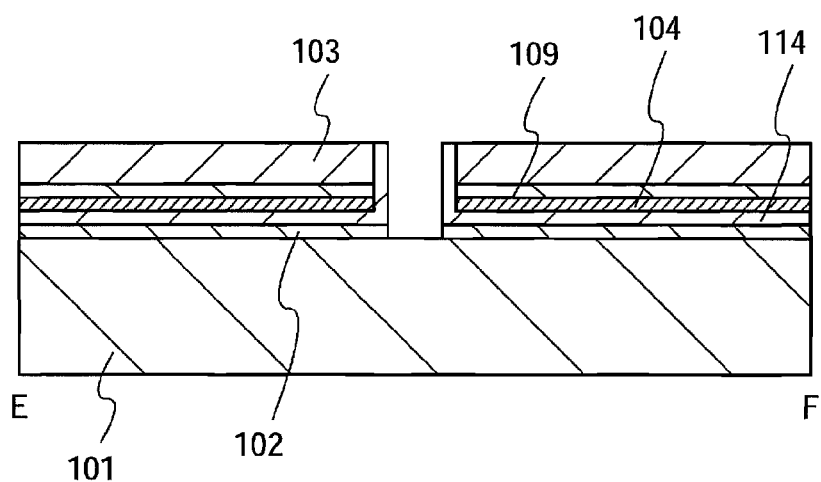

FIG. 7 is a plan view where a plurality of semiconductor layers 103 is arranged and bonded to a substrate 101. FIGS. 8A and 8B show cross-sectional views corresponding to lines C-D and E-F in FIG. 7, respectively. The semiconductor layers 103 are arranged over the substrate 101 through steps shown in FIGS. 4A to 5B. The semiconductor layer 103 is fixed to the substrate 101 with the bonding layer 102 interposed therebetween. The first electrode 104 and the silicon nitride layer 114 are provided between the bonding layer 102 and the semiconductor layer 103. Bond strength between the substrate 101 and the bonding layer 102 can be increased by thermal treatment. Even in the case where the substrate 101 has a large area, thermal treatment for forming a bond can be easily performed by using a rapid thermal annealing method (RTA method) in which light from a lamp is emitted.

After that, steps shown in FIGS. 6A and 6B are performed, so that a first impurity semiconductor layer 105 is formed in the semiconductor layer 103. The first impurity semiconductor layer 105 is formed by provision of an opening and by doping with an impurity element which can control a valence electron of a semiconductor, after an insulating layer 115 is formed over the semiconductor layer 103. An ion doping apparatus is used in this step so that this step can be performed in the state where a plurality of semiconductor layers 103 is fixed to the substrate 101.

Figure 10A:
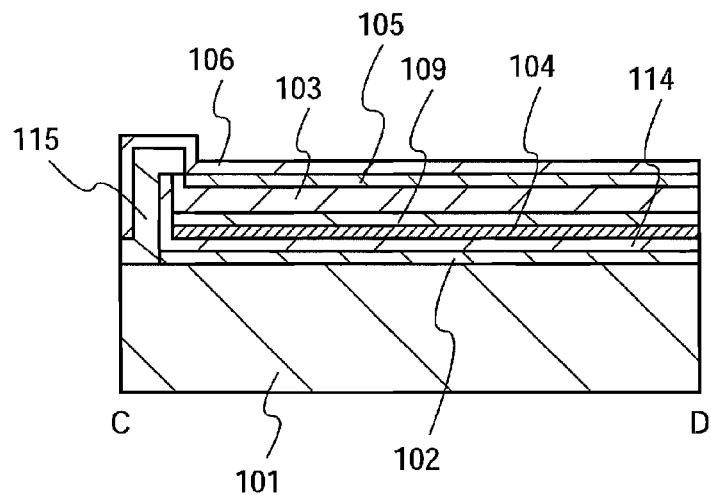
FIGS. 10A and 10B are cross-sectional views illustrating manufacturing steps of a solar photovoltaic module relating to an embodiment mode.
Figure 10B:
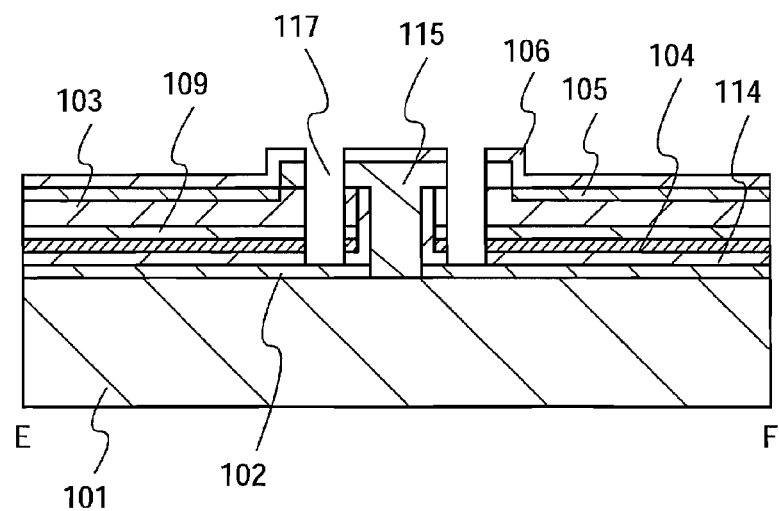

FIG. 9 shows a step in which a contact hole 117 is formed which is connected to the first electrode 104. FIGS. 10A and 10B show cross-sectional views corresponding to lines C-D and E-F in FIG. 9, respectively. The contact hole 117 penetrates a protective film 106 and the semiconductor layer 103. The protective film 106 and the semiconductor layer 103 are processed with a laser beam, whereby the contact hole 117 can be formed. By scanning of a laser beam over the substrate

101, a contact hole can be simply and easily formed in the plurality of semiconductor layers 103.

Figure 11:
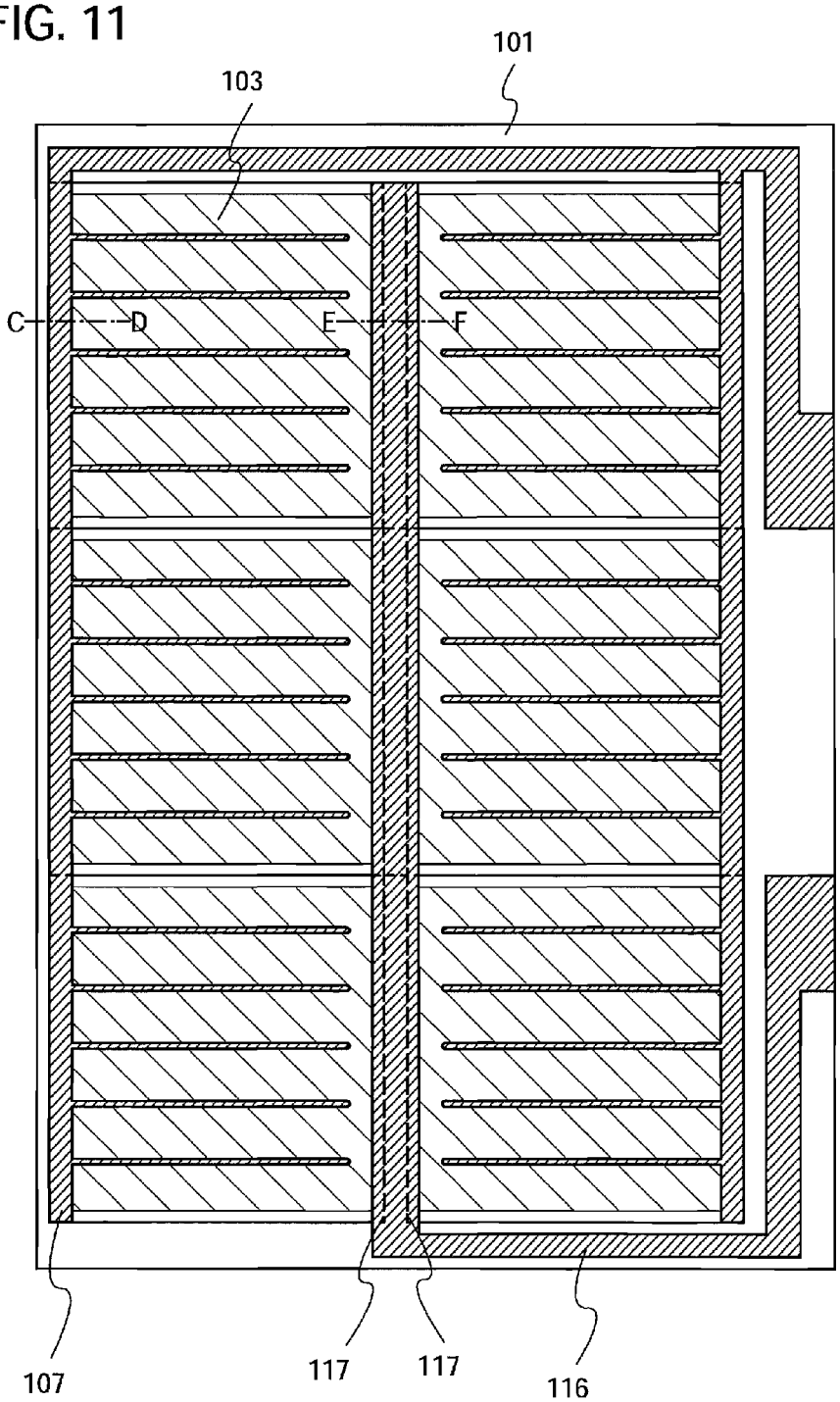
FIG. 11 is a plan view illustrating manufacturing steps of a solar photovoltaic module relating to an embodiment mode.
Figure 12A:
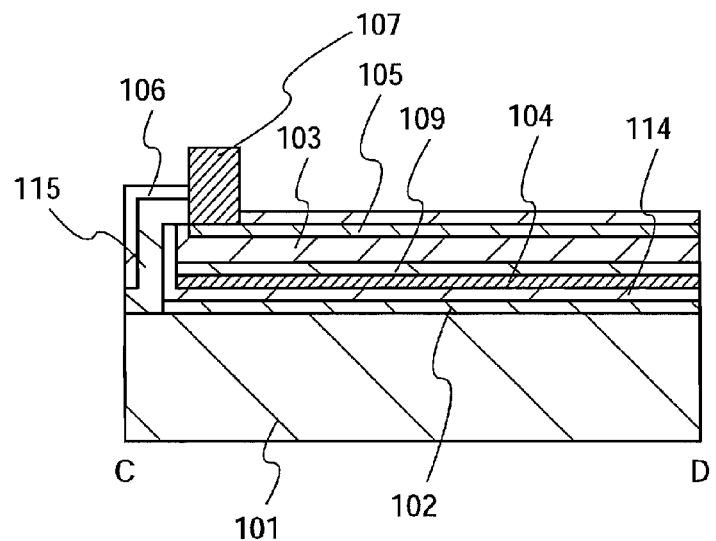
FIGS. 12A and 12B are cross-sectional views illustrating manufacturing steps of a solar photovoltaic module relating to an embodiment mode.
Figure 12B:
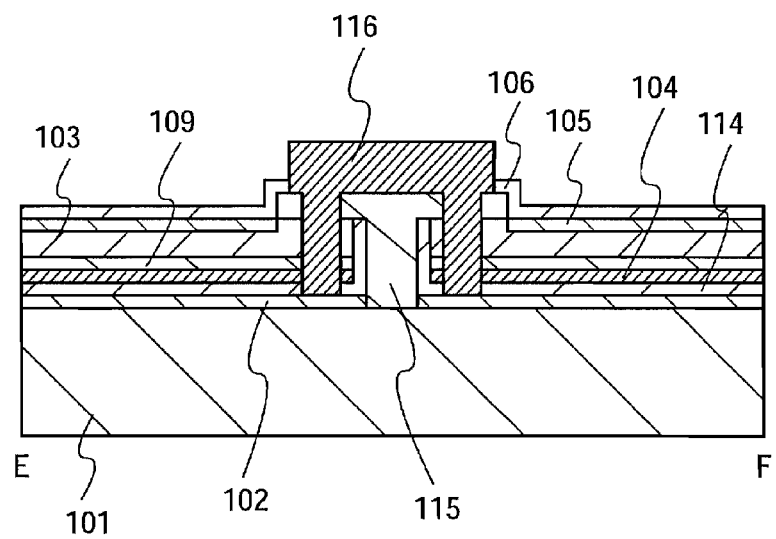

FIG. 11 shows a step of forming electrodes of a photovoltaic device. FIGS. 12A and 12B show cross-sectional views corresponding to lines C-D and E-F in FIG. 11, respectively. An extraction electrode 116 is electrically connected to the first electrode 104 by the contact hole 117. A second electrode 107 is formed into a comb shape over the semiconductor layer 103. Further, the second electrode 107 and the extraction electrode 116 are led out over the substrate 101, and a connection terminal of the solar photovoltaic module and the second electrode 107 or the extraction electrode 116 are formed as one element. The second electrode 107 and the extraction electrode 116 are formed from a material such as aluminum, silver, lead-tin (solder), or the like. For example, the second electrode 107 and the extraction electrode 116 are formed using a silver paste by a screen printing method. The second electrode 107 and the extraction electrode 116 form a connection terminal when being led over the substrate 101.

In such a manner, a solar photovoltaic module can be manufactured in which a plurality of photovoltaic devices is arranged over one substrate. According to this mode, a single crystal photovoltaic device can be manufactured at a process temperature less than or equal to 700° C. (preferably, less than or equal to 500° C.). That is, a high-efficiency solar photovoltaic module provided with a single crystal semiconductor layer can be manufactured over a large-area glass substrate with an upper temperature limit of 700° C. or lower.

It is to be noted that although this mode shows the case of using the photovoltaic device described in the manufacturing steps 1, a solar photovoltaic module can be similarly manufactured also in the case of using the photovoltaic device described in the manufacturing steps 2.

This application is based on Japanese Patent Application serial no. 2007-101182 filed with Japan Patent Office on Apr. 6, 2007, the entire contents of which are hereby incorporated by reference.

What is claimed is:

1. A method for manufacturing a photovoltaic device, comprising:
    introducing one kind of ions or plural kinds of ions of different masses each comprising a same atom, which are produced by subjecting a source gas selected from hydrogen, helium, or halogen to plasma excitation, into a single crystal semiconductor substrate to form a separation layer in a region of the single crystal semiconductor substrate at a predetermined depth from the surface of the single crystal semiconductor substrate,
    forming a silicon oxide film over the single crystal semiconductor substrate by a chemical vapor deposition method with the use of an organic silane gas;
    bonding the single crystal semiconductor substrate to a substrate having an insulating surface by superposition thereof with the silicon oxide film interposed therebetween;
    performing thermal treatment in a state where the single crystal semiconductor substrate and the substrate having an insulating surface are superposed on each other to generate cleavage in the separation layer, and separating and removing the single crystal semiconductor substrate with a single crystal semiconductor layer left over the substrate having an insulating surface, and
    forming an impurity semiconductor layer as a photoelectric conversion layer by addition of an impurity element to the single crystal semiconductor layer.

2. The method for manufacturing a photovoltaic device according to claim 1, wherein as the organic silane gas, one kind selected from tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) is used.

3. The method for manufacturing a photovoltaic device according to claim 1, wherein a temperature at which the silicon oxide film is formed over the single crystal semiconductor substrate by a chemical vapor deposition method with the use of an organic silane gas is a temperature at which an element introduced into the separation layer does not leave, and the thermal treatment is performed at a temperature at which an element introduced into the separation layer leaves.

4. The method for manufacturing a photovoltaic device according to claim 1, wherein a temperature at which the silicon oxide film is formed over the single crystal semiconductor substrate by a chemical vapor deposition method with the use of an organic silane gas is 350° C. or lower, and the thermal treatment is performed at 400° C. or higher.

5. The method for manufacturing a photovoltaic device according to claim 1, wherein the separation layer is formed by introduction of $H^+$, $H_2^+$, and $H_3^+$ ions with a high proportion of $H_3^+$ ions.

6. A method for manufacturing a photovoltaic device, comprising:
    introducing one kind of ions or plural kinds of ions of different masses each comprising the same atom, which are produced by subjecting a source gas selected from hydrogen, helium, or halogen to plasma excitation, into a single crystal semiconductor substrate to form a separation layer in a region of the single crystal semiconductor substrate at a predetermined depth from a surface of the single crystal semiconductor substrate,
    adding an impurity element which controls conductivity in a region of the single crystal semiconductor substrate at a depth shallower than that of the separation layer formed in the single crystal semiconductor substrate to form an impurity semiconductor layer;
    forming a first electrode over the impurity semiconductor layer;
    forming a silicon oxide film over the first electrode by a chemical vapor deposition method with the use of an organic silane gas;
    bonding the single crystal semiconductor substrate to a substrate having an insulating surface by superposition thereof with the silicon oxide film interposed therebetween;
    performing thermal treatment in a state where the single crystal semiconductor substrate and the substrate having an insulating surface are superposed on each other to generate cleavage in the separation layer, and separating the single crystal semiconductor substrate to form a single crystal semiconductor layer over the substrate having an insulating surface;
    forming an impurity semiconductor layer having opposite conductivity to the impurity semiconductor layer, in the single crystal semiconductor layer, and
    forming a second electrode over the impurity semiconductor layer having opposite conductivity.

7. The method for manufacturing a photovoltaic device according to claim 6, wherein as the organic silane gas, one kind selected from tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: SiH(OC$_2$H$_5$)$_3$), or trisdimethylaminosilane (chemical formula: SiH(N(CH$_3$)$_2$)$_3$ is used.

8. The method for manufacturing a photovoltaic device according to claim 6, wherein a temperature at which the silicon oxide film is formed over the single crystal semiconductor substrate by a chemical vapor deposition method with the use of an organic silane gas is a temperature at which an element introduced into the separation layer does not leave, and the thermal treatment is performed at a temperature at which an element introduced into the separation layer leaves.

9. The method for manufacturing a photovoltaic device according to claim 6, wherein a temperature at which the silicon oxide film is formed over the single crystal semiconductor substrate by a chemical vapor deposition method with the use of an organic silane gas is 350° C. or lower, and the thermal treatment is performed at 400° C. or higher.

10. The method for manufacturing a photovoltaic device according to claim 2, wherein the separation layer is formed by introduction of H$^+$, H$_2$$^+$, and H$_3$$^+$ ions with a high proportion of H$_3$$^+$ ions.

* * * * *